(12) United States Patent
Morishima

(10) Patent No.: US 6,337,818 B1
(45) Date of Patent: Jan. 8, 2002

(54) SEMICONDUCTOR MEMORY DEVICE HAVING A REDUNDANCY CONSTRUCTION

(75) Inventor: Chikayoshi Morishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/773,709

(22) Filed: Feb. 2, 2001

(30) Foreign Application Priority Data

Jun. 20, 2000 (JP) ............................................ 12-184380

(51) Int. Cl.$^7$ ................................................. G01C 7/00
(52) U.S. Cl. ......................................... 365/200; 365/63
(58) Field of Search .......................... 365/200, 63, 207, 365/208

(56) References Cited

U.S. PATENT DOCUMENTS 5,204,836 A * 4/1993 Reed ........................... 365/200
5,379,258 A   1/1995 Murakami et al. ........... 365/200
5,548,553 A * 8/1996 Cooper et al. ............... 365/200
5,574,688 A * 11/1996 McClure et al. ............. 365/200
6,249,465 B1 * 6/2001 Weiss et al. ................. 365/200

FOREIGN PATENT DOCUMENTS

JP          3-22299     1/1991
JP          2837433    10/1998

* cited by examiner

Primary Examiner—Son T. Dinh
(74) Attorney, Agent, or Firm—McDermott, Will & Emery

(57) ABSTRACT

A semiconductor memory device includes a plurality of column groups (memory blocks M1 to M9), a plurality of column selection circuits and a plurality of read/write circuits disposed in correspondence with the plurality of column groups, a redundancy selection circuit that selects connection to the read/write circuit by shifting the connection, and input/output circuits that selectively connect an input/output node of the redundancy selection circuit with the data input/output line.

8 Claims, 10 Drawing Sheets

SEMICONDUCTOR MEMORY DEVICE HAVING A REDUNDANCY CONSTRUCTION

BACKGROUND OF THE INVENTION

1. Field of the Invention

The present invention relates to a semiconductor memory device, and more particularly to a construction of a semiconductor memory device having a redundancy construction.

2. Description of the Background Art

From the past days, in semiconductor memory devices, it is essential to add a redundancy circuit for improvement in the yield.

An example of such a redundancy circuit construction is "deficient bit relieving circuit in a semiconductor memory device" (Japanese Patent Application No. 2837433: Document 1). In this deficient bit relieving circuit, signals on and after the row or column line that is connected to a deficient memory cell are shifted to an adjacent row or column line thereby to exclude the deficient memory cell.

FIG. 9 shows a construction of the deficient bit relieving circuit shown in Document 1. Referring to FIG. 9, Ci−1 to Cj+3 represent columns; Yi−1 to Yj+3 represent column decoder output signal lines; QAi−1, QBi−1, QAi, QBi, QBj−1, QAj, QBj, QAj+1, and QBj+1 represent switching elements; CB1 and CB2 represent common data lines, MC represents a memory cell, BL and /BL represent bit lines that are complementary with each other, and the reference numeral 9 represents a column selection gate.

The bit lines of the columns other than the column Cj+1 that is positioned at the boundary of Section I and Section II are each connected to either one of two common data lines via a column selection gate.

The bit line BL of the column Cj+1 is connected to the common data line CB1 via a transfer gate TG1 and is also connected to the common data line CB2 via a transfer gate TG2. The complementary bit line /BL of the column Cj+1 is connected to the common data line CB1 via a transfer gate TG1' and is also connected to the common data line CB2 via a transfer gate TG2'.

The gate of each of the transfer gates TG1, TG1' is connected to the column decoder output signal line Yj via the switching element QBj. The gate of each of the transfer gates TG2, TG2' is connected to the column decoder output signal line Yj+1 via the switching element QAj+1.

The switching elements QBj and QAj+1 satisfy a relation such that, if one is in a conducted state, the other is a non-conducted state.

Even if a column Ci becomes deficient and the column decoder output signal line Yj is connected to the column Cj+1, the column Cj+1 is connected to Section I by the transfer gates TG1 and TG1'.

However, if the pertinent deficient bit relieving circuit is adopted for relieving a column line of the semiconductor memory device, the column lines must be shifted, thereby necessitating a complex construction at the boundary of the Sections (column groups).

In the meantime, a semiconductor memory device 9500 shown in FIG. 10 represents a redundancy construction in which the circuit construction at the boundary of the column groups is more simplified. Referring to FIG. 10, XM1 to XM3 represent memory blocks including a plurality of memory cells arranged in a matrix form, a plurality of column lines, and a plurality of row lines; 901 to 903 represent column selection circuits disposed respectively in correspondence with the memory blocks XM1 to XM3; 911 to 913 represent read/write circuits disposed respectively in correspondence with the column selection circuits 901 to 903; 920 represents a redundancy selection circuit; and DQ1 and DQ2 represent input/output data signals that are output from the redundancy selection circuit 920 or input into the redundancy selection circuit 920.

Each of the memory blocks XM1 to XM3 constitutes a column group. The column selection circuits 901 to 903 select one of the plurality of column lines in the corresponding memory block in accordance with the column selection signals Y1 to Yx. The read/write circuits 911 to 913 include circuits for reading data from or writing data into the memory cells via the corresponding column selection circuit. The read/write circuits 911 to 913 are activated in accordance with a read control signal SE or is activated in accordance with a write control signal WE.

The redundancy selection circuit 920 connects the node F1 with either one of the nodes E1 and E2 that are connected with the read/write circuits 911, 912, and connects the node F2 with either one of the nodes E2 and E2 that are connected with the read/write circuits 912, 913.

The redundancy selection circuit 920 shifts the connection relationship of the nodes F1 and F2 in accordance with the redundancy selection signals R1, R2. By shifting the connection relationship, two of the outputs of the read/write circuits 911 to 913 are transmitted to the nodes F1, F2.

Thus, in the semiconductor memory device 9500, a memory block including spare memory cells for one column group is prepared, whereby a column group (memory block XM2) including a deficient memory cell is excluded by selecting the outputs of the column groups.

However, such a construction of the semiconductor memory device 9500 necessitates redundancy memory cells for one column group although the construction at the boundary of the column groups is not complicated.

If the number of columns included in one column group is 16, redundancy memory cells for 16 columns are required. If the number of columns included in one column groups is 64, redundancy memory cells for 64 columns are required. Therefore, it raises a problem that, according as the number of columns included in one column group increases, the area efficiency decreases.

SUMMARY OF THE INVENTION

Thus, the present invention provides a semiconductor memory device having a redundancy construction with a good area efficiency with the use of a simple circuit construction.

A semiconductor memory device according to one aspect of the present invention includes a memory cell array including m memory blocks (m is an integer not smaller than 2) each having a plurality of memory cells arranged in a matrix form and n column lines (n is an integer) connected to the corresponding memory cells; m first selection circuits disposed respectively in correspondence with the m memory blocks, each of the m first selection circuits selecting one of the n column lines included in the corresponding one of the m memory blocks; m data processing circuits disposed respectively in correspondence with the m first selection circuits, each of the m data processing circuits including an amplification circuit for amplifying read data from the corresponding first selection circuit and a write circuit for outputting write data to the corresponding first selection circuit; a redundancy selection circuit that includes m first nodes and (m−1) second nodes for respectively giving and receiving data to and from the m data processing circuits and selectively connects (m−1) first nodes with the (m−1) second nodes by shifting connections to exclude one of the m first nodes; and a second selection circuit that selects one of k second nodes (k≦m−1: k is an integer) for giving and receiving data.

Preferably, (m−1)/k amplification circuits are activated among the m amplification circuits at the time of reading data from the memory cell array. In particular, the amplification circuit is activated at the time of reading data from the corresponding memory block.

Preferably, (m−1)/k write circuits are activated among the m write circuits at the timing of writing data to the memory cell array. In particular, the write circuit is activated at the time of writing data to the corresponding memory block.

A semiconductor memory device according to a further aspect of the present invention includes a memory cell array including m memory blocks (m is an integer not smaller than 2) each having a plurality of memory cells arranged in a matrix form and n column lines (n is an integer) connected to the corresponding memory cells; m first selection circuits disposed respectively in correspondence with the m memory blocks, each of the m first selection circuits selecting one of the n column lines including in the corresponding one of the m memory blocks; a redundancy selection circuit that includes m first nodes and (m−1) second nodes for respectively giving and receiving data to and from the m first selection circuits and selectively connects (m−1) first nodes with the (m−1) second nodes by shifting connections to exclude one of the m first nodes; a second selection circuit that selects one of k second nodes (k≦m−1: k is an integer) for giving and receiving data; and an amplification circuit for amplifying data output from the second selection circuit and a write circuit for outputting data to the second selection circuit.

Preferably, the second selection circuit includes a plurality of gates that are disposed respectively in correspondence with the k second nodes and are connected to the amplification circuit and the write circuit. In particular, the second selection circuit, the write circuit, and the amplification circuit are disposed in a plural number, and only write circuit for writing data to memory block that constitutes an object of writing data is operated among the write circuits disposed in the plural number.

Thus, according to the semiconductor memory device of the present invention, substitution with reduced area can be made with a simple circuit construction by including a read/write circuit, a redundancy selection circuit that selects an input/output node of the read/write circuit, and an input/output circuit that selectively connects the input/output node of the redundancy selection circuit with the data input/output line.

Further, according to the semiconductor memory device of the present invention, substitution with reduced area can be made with a simple circuit construction by including a column selection circuit, a redundancy selection circuit that selects an input/output node of the column selection circuit, and a selection circuit that selects the input/output node of the redundancy selection circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

These and other objects, features, objects, and advantages of the present invention will become more apparent from the following detailed description of the present invention when taken in conjunction with the accompanying drawings, in which.

DESCRIPTION OF THE PREFERRED EMBODIMENTS

Figure 1:
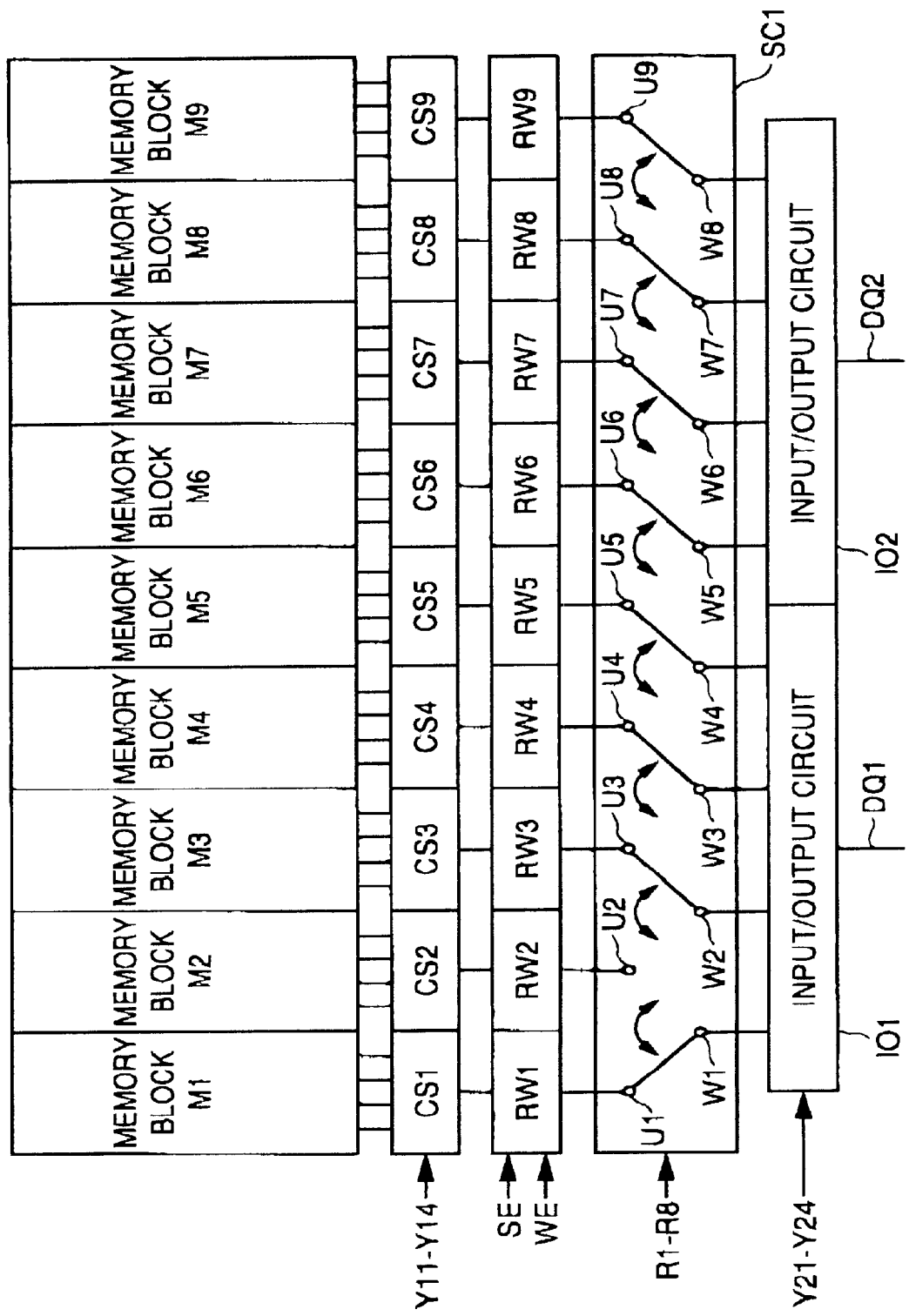
FIG. 1 is a view illustrating a construction of a principal part of a semiconductor memory device 1000 according to a first embodiment.

Hereafter, preferred embodiments of the present invention will be described in detail with reference to the attached drawings, where like or corresponding parts are denoted with like reference numerals or symbols and their explanation will be omitted.

(First Embodiment)

A semiconductor memory device 1000 according to the first embodiment of the present invention will be described with reference to FIG. 1. Referring to FIG. 1, the semiconductor memory device 1000 includes a plurality of memory blocks M1 to M9, column selection circuits CS1 to CS9 that are disposed respectively in correspondence with the memory blocks, read/write circuits RW1 to RW9 that are disposed respectively in correspondence with the column selection circuits CS1 to CS9, a redundancy selection circuit SC1, and input/output circuits IO1, IO2.

Each of the memory blocks M1 to M9 includes a plurality of memory cells disposed in a matrix form, a plurality of row lines disposed in a row direction, and a plurality of column lines disposed in a column direction. As an example, it is assumed that each of the memory blocks is constructed with four columns. A corresponding memory cell is selected by means of a row line and a column line.

Each of the column selection circuits CS1 to CS9 selects one of the four column lines in the corresponding memory block in accordance with the column selection signals Y11 to Y14. The read/write circuits RW1 to RW9 each include a circuit for reading data from or for writing data to the memory cells via the column selection circuit. Each of the read/write circuits RW1 to RW9 operates in accordance with a read control signal SE that controls a reading operation and a write control signal WE that controls a writing operation.

Each of the read/write circuits RW1, RW2, RW3, RW4, RW5, RW6, RW7, RW8, RW9 gives and receives data to and from the input/output circuit via nodes U1, U2, U3, U4, U5, U6, U7, U8, U9.

The redundancy selection circuit SC1 connects either one of the nodes U1, U2, with the node W1, connects either one of the nodes U2, U3 with the node W2, connects either one of the nodes U3, U4 with the node W3, and connects either one of the nodes U4, U5 with the node W4.

The redundancy selection circuit SC1 further connects either one of the nodes U5, U6 with the node W5, connects either one of the nodes U6, U7 with the node W6, connects either one of the nodes U7, U8 with the node W7, and connects either one of the nodes U8, U9 with the node W8.

The redundancy selection circuit SC1 shifts connections to exclude one of the nodes U1 to U9 in accordance with redundancy selection signals R1 to R8. Except for one of the nodes Ui (i=1 to 9), the nodes Uj (j≠i) are connected to either one of the nodes Wj and Wj−1. However, the node U1 is either connected to the node W1 or is in a non-connected state, and the node U9 is either connected to the node W8 or is in a non-connected state.

By shifting connections, eight signals out of the nine signals output from the read/write circuits RW1 to RW9 are transmitted to the nodes W1 to W8, or alternatively the eight signals of the nodes W1 to W8 are transmitted to eight circuits out of the read/write circuits RW1 to RW9.

Input/output selection signals Y21 to Y24 are transmitted to the read/write circuit via the nodes W1 to W8, and the data for writing or the data for reading are given or received via the nodes W1 to W8.

Figure 2:
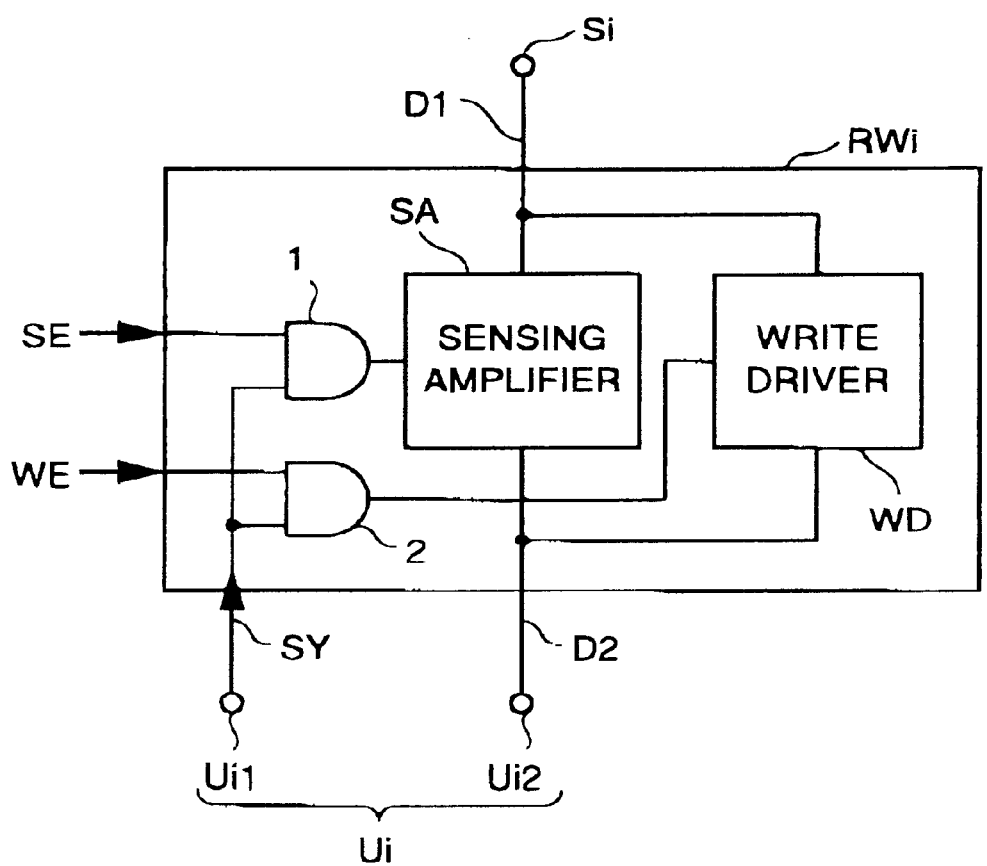
FIG. 2 is a circuit diagram illustrating a construction of a read/write circuit RWi according to the first embodiment.

Next, the read/write circuits RWi (i=1 to 9) according to the first embodiment will be described in detail with reference to FIG. 2. Referring to FIG. 2, the symbol Si represents a connection node that connects the read/write circuit RWi with the column selection circuit CSi, and the symbol D1 represents a data signal of the node Si. The nodes Ui (i=1 to 9) include nodes Ui1 and node Ui2. The symbol SY represents an input/output selection signal that is received by the node Ui1, and the symbol D2 represents a data signal of the node Ui2.

The read/write circuits RWi (i=1 to 9) illustrated in FIG. 2 include AND circuits 1, 2, a sensing amplifier SA, and a write driver WD. The AND circuit 1 receives the read control signal SE and the input/output selection signal SY as an input. The AND circuit 2 receives the write control signal WE and the input/output selection signal as an input.

The sensing amplifier SA is activated in accordance with the output of the AND circuit 1, and amplifies the data signal D1 to output the data signal D2. The sensing amplifier SA outputs the data (read data) of a selected column line to the redundancy selection circuit side.

The write driver WD is activated in accordance with the output of the AND circuit 2, and outputs the data signal D1 in accordance with the data signal D2. The write driver WD writes the data for writing into the memory cells of the selected column line.

Therefore, when the input/output selection signal SY is at a H-level, the sensing amplifier SA or the write driver WD is operated in accordance with the write control signal WE or the read control signal SE.

Figure 3:
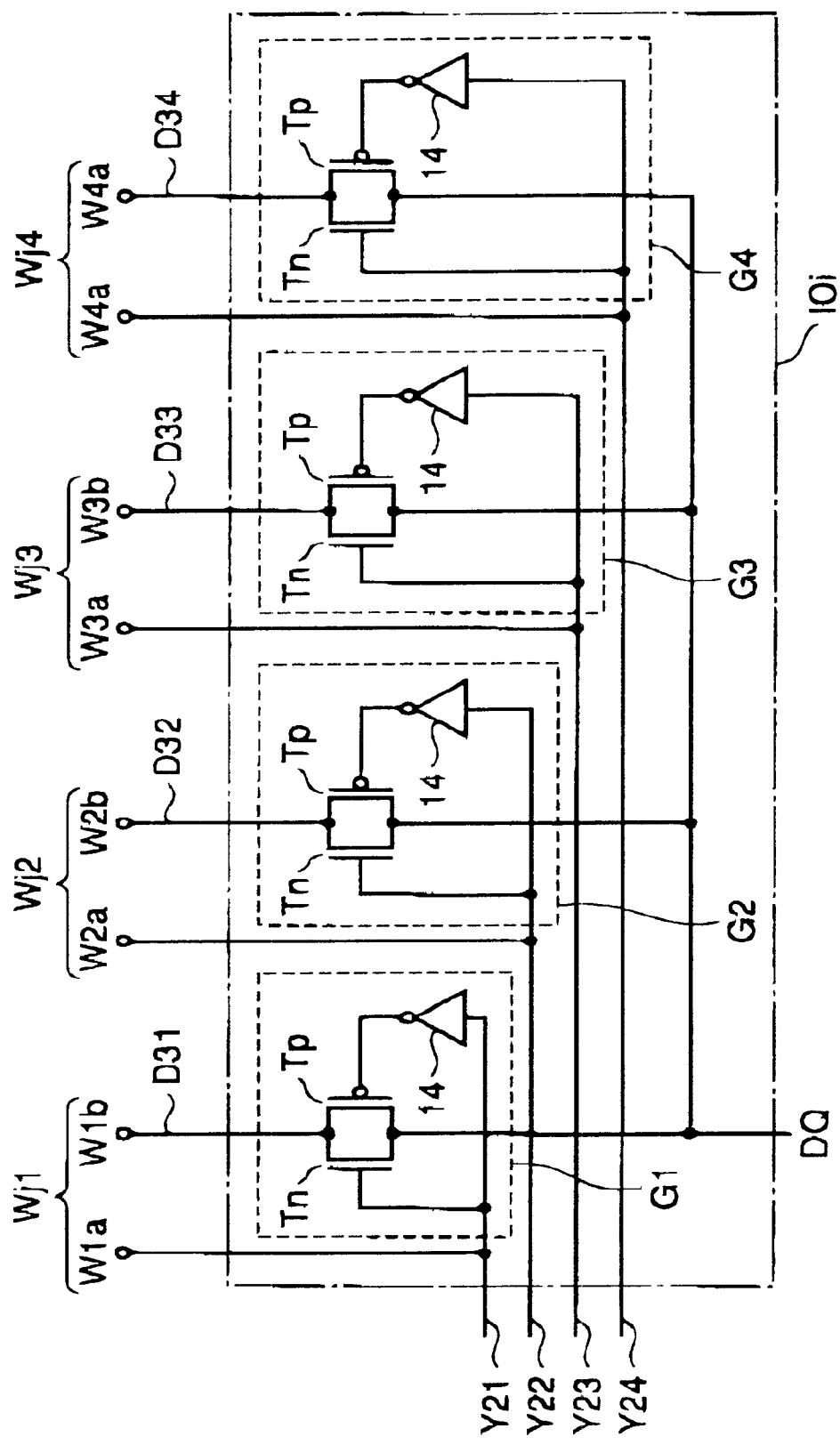
FIG. 3 is a circuit diagram illustrating a construction of an input/output circuit IOi according to the first embodiment.

Next, the input circuits IOi (i=1, 2) according to the first embodiment of the present invention will be described in detail with reference to FIG. 3. In FIG. 3, the symbols Wj1 to Wj4 correspond to the nodes W1 to W4 shown in FIG. 1 if it is the input/output circuit IO1, and correspond to the nodes W5 to W8 shown in FIG. 1 if it is the input/output circuit IO2. The node Wj1 (W1, W5) includes nodes W1a and W1b. The node Wj2 (W2, W6) includes nodes W2a and W2b. The node Wj3 (W3, W7) includes nodes W3a and W3b. The node Wj4 (W4, W8) includes nodes W4a and W4b.

The symbol D31 represents the data signal of the node W1b; the symbol D32 represents the data signal of the node W2b; the symbol D33 represents the data signal of the node W3b; and the symbol D34 represents the data signal of the node W4b. Further, the symbol DQ represents a data input/output line or a data signal, and signifies DQ1 in FIG. 1 if it is the input/output circuit IO1, and signifies DQ2 in FIG. 1 if it is the input/output circuit IO2.

The input/output selection signals are transmitted to the read/write circuit via the nodes Wka (k=1 to 4). Specifically, the input/output selection signal Y21 is transmitted via the node W1a, the input/output selection signal Y22 is transmitted via the node W2a, the input/output selection signal Y23 is transmitted via the node W3a, and the input/output selection signal Y24 is transmitted via the node W4a to the read/write circuit.

The input/output circuit IO1 includes gates G1 to G4. Each of the gates G1 to G4 includes transistors Tn and Tp, and an inverter 14. The transistor Tp is a PMOS transistor, and the transistor Tn is an NMOS transistor.

The input/output selection signal Y21 is supplied to the gate G1; the input/output selection signal Y22 is supplied to the gate G2; the input/output selection signal Y23 is supplied to the gate G3; and the input/output selection signal Y24 is supplied to the gate G4. The inverter 14 of the gates G1 to G4 inverts the corresponding input/output selection signal. The gate Gi (i=1 to 4) is turned on/off by the input/output selection signal Y2i and the output of the inverter 14.

When the gate G1 is turned on, the data signal D31 received by the node W1b is transmitted to the data input/output line DQ (to become the data signal DQ), or alternatively the data signal DQ of the data input/output line DQ is transmitted to the read/write circuit as the data signal D31.

When the gate G2 is turned on, the data signal D32 received by the node W2b is transmitted to the data input/output line DQ (to become the data signal DQ), or alternatively the data signal DQ of the data input/output line DQ is transmitted to the read/write circuit as the data signal D32.

When the gate, G3 is turned on, the data signal D33 received by the node W3b is transmitted to the data input/output line DQ (to become the data signal DQ), or alternatively the data signal DQ of the data input/output line DQ is transmitted to the read/write circuit as the data signal D33.

When the gate G4 is turned on, the data signal D34 received by the node W4b is transmitted to the data input/output line DQ (to become the data signal DQ), or alternatively the data signal DQ of the data input/output line DQ is transmitted to the read/write circuit as the data signal D34.

Figure 4:
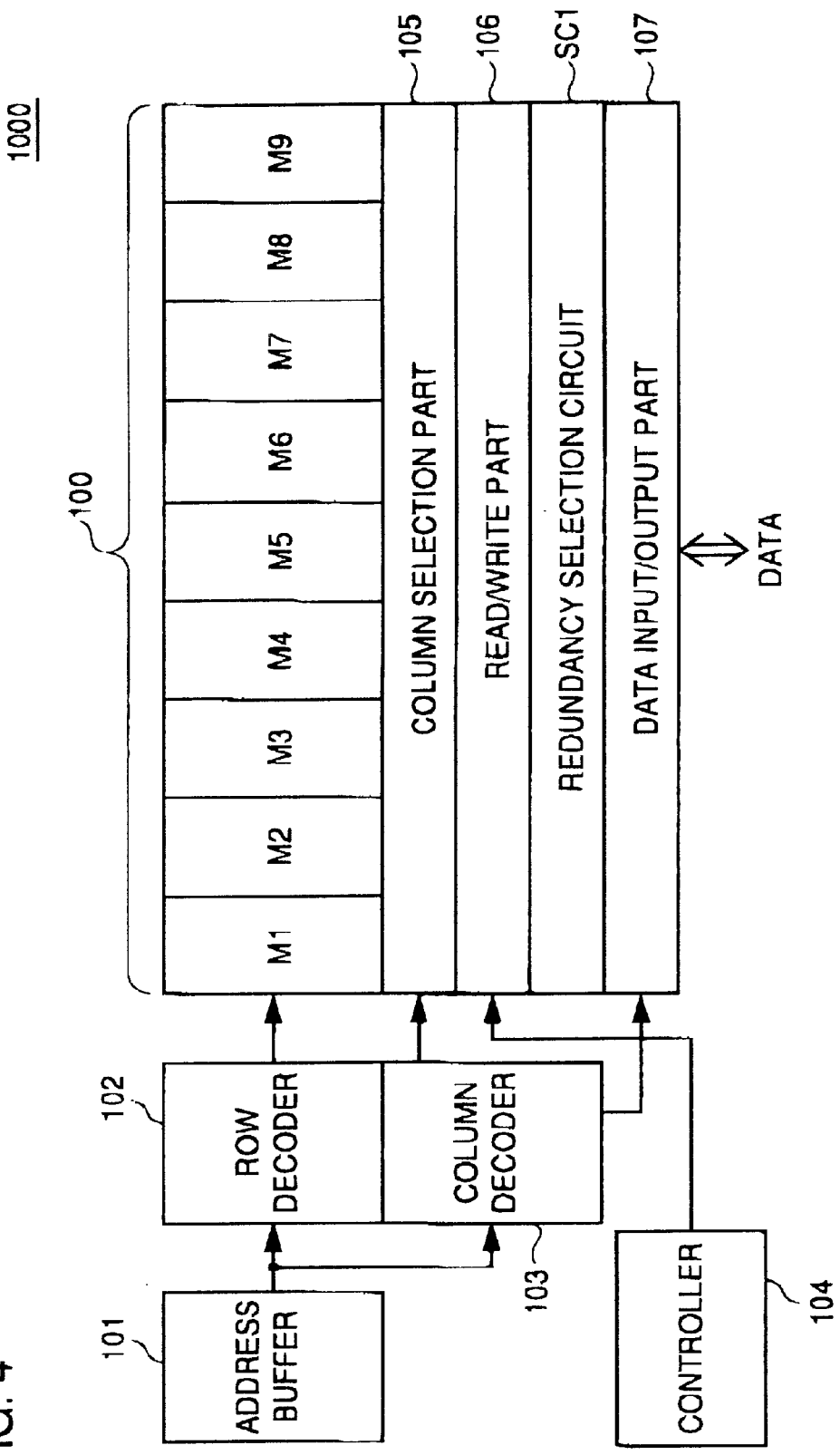
FIG. 4 is a block diagram illustrating a schematic overall construction of the semiconductor memory device 1000 according to the first embodiment.

FIG. 4 illustrates an overall construction of the semiconductor memory device 1000 according to the first embodiment of the present invention. Referring to FIG. 4, the semiconductor memory device 1000 includes a memory cell array 100 including the memory blocks M1 to M9, an address buffer 101 that receives an address, a row decoder 102 that outputs an inner row address for selecting a row line by decoding the output of the address buffer 101, a column decoder 103 that outputs the column selection signals Y11 to Y14 and the input/output selection signals Y21 to Y24 by decoding the output of the address buffer 101, and a controller 104 for controlling internal operations.

The semiconductor memory device 1000 further includes a column selection part 105 including the column selection circuits CS1 to CS9, a read/write part 106 including the read/write circuits RW1 to RW9, a redundancy selection circuit SC1, and a data input/output part 107 including the input/output circuits IO1 and IO2.

The column selection part 105 receives the column selection signals Y11 to Y14 from the column decoder 103, and the data input/output part 107 receives the input/output selection signals Y21 to Y24 from the column decoder 103. The read/write part 106 receives the read control signal SE and the write control signal WE from the controller 104.

Figure 5:
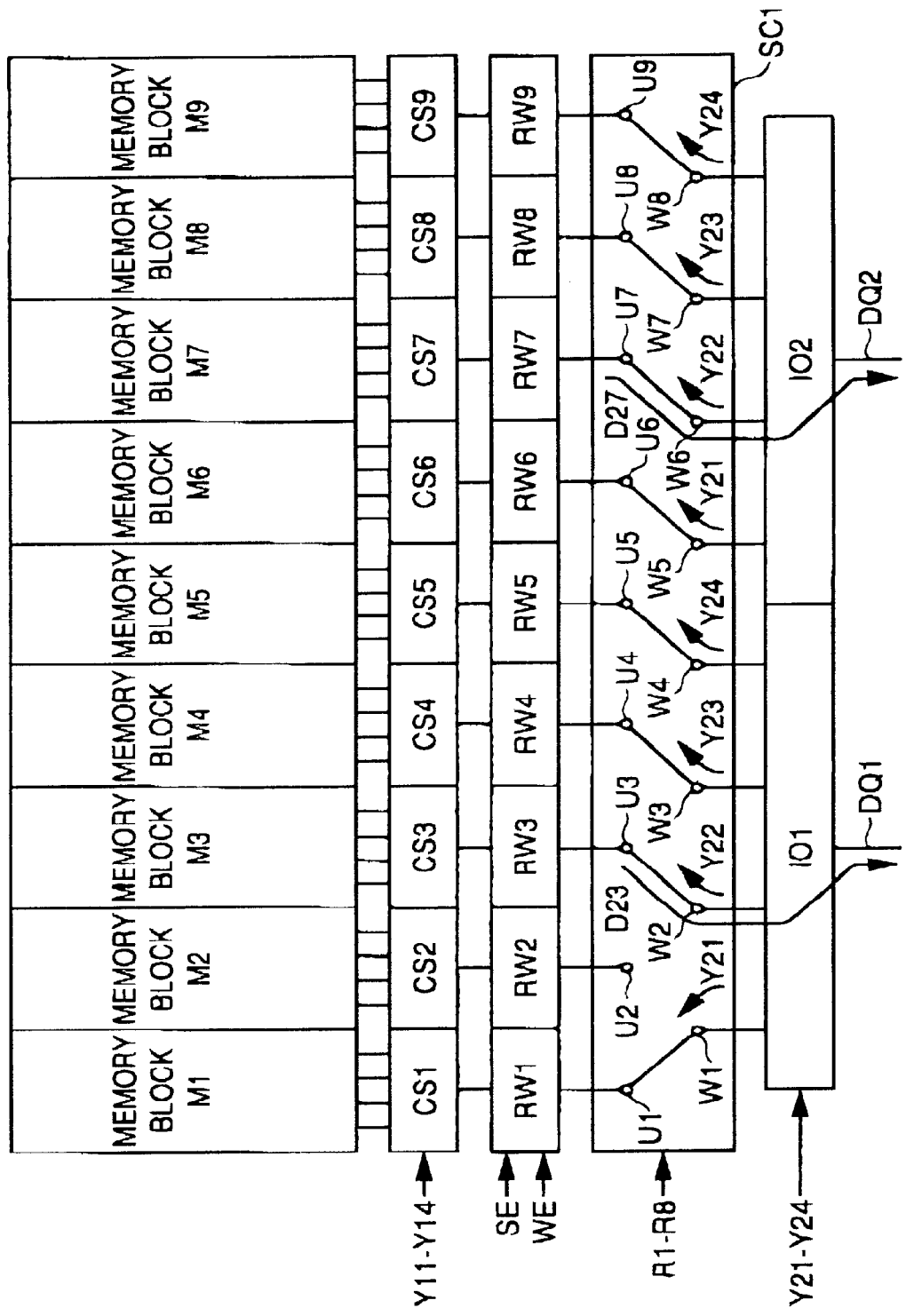
FIG. 5 is a conceptual view for describing the operation of the semiconductor memory device 1000 according to the first embodiment.

Next, the operation of the semiconductor memory device 1000 according to the first embodiment of the present invention will be described with reference to FIG. 5. Referring to FIG. 5, it is assumed that the memory block M2 includes a deficient memory cell. Here, the arrows from the symbol D23 to DQ1 and from the symbol D27 to DQ2 shown in FIG. 5 represent a flow of the data read from the memory cells particularly in a reading operation mode. In a writing operation mode, the write data flows in a direction opposite to the aforesaid arrows.

In the redundancy selection circuit SC1, connection is set in advance as shown in FIG. 1 before the operation of the circuits in accordance with the redundancy selection signals R1 to R8. More specifically, the node W1 is connected to the node U1, the node W2 to the node U3, the node W3 to the node U4, the node W4 to the node U5, the node W5 to the node U6, the node W6 to the node U7, the node W7 to the node U8, and the node W8 to the node U9. The node U2 is fixed at a L-level.

In the reading operation mode, the read control signal SE is set at a H-level, and the write control signal WE is set at a L-level. Addresses of the memory cells constituting an object of reading are input as the column selection signals Y11 to Y14 and the input/output selection signals Y21 to Y24.

As an example, the input/output selection signals Y21, Y23, Y24 are set at a L-level and Y22 is set at a H-level. It is assumed that the data of the memory block M3, M7 are to be read out.

The input/output selection signals Y21 to Y24 are input into the redundancy selection circuit SC1 via the input/output circuits IO1, IO2. Further, the input/output selection signal Y21 is transmitted from the node W1 to the node U1, and from the node W5 to the node U6. The input/output selection signal Y22 is transmitted from the node W2 to the node U3, and from the node W6 to the node U7. The input/output selection signal Y23 is transmitted from the node W3 to the node U4, and from the node W7 to the node U8. The input/output selection signal Y24 is transmitted from the node W4 to the node U5, and from the node W8 to the node U9.

The read/write circuits RW1, RW2, RW4 to RW6, RW8, RW9 receive the input/output selection signals (corresponding to SY in FIG. 2) of a L-level. In the read/write circuits RW1, RW2, RW4 to RW6, RW8, RW9, the sensing amplifier SA is not operated (non-activated state), since the output of the AND circuit 1 is at a L-level.

On the other hand, the read/write circuits RW3, RW7 receive the input/output selection signal Y22 (corresponding to SY in FIG. 2) of a H-level. In the read/write circuits RW3, RW7, the sensing amplifier SA is in an operated state (activated state), since the output of the AND circuit 1 is at a H-level.

By this, each of the read/write circuits RW3, RW7 amplifies the data signals (corresponding to D1 in FIG. 2) received from the corresponding column selection circuits CS3, CS7 and outputs data signals D23, D27 (corresponding to D2 in FIG. 2).

The data signal D23 output from the read/write circuit RW3 is input into the input/output circuit IO1 from the node U3 (Ui2 in FIG. 2) via the node W2 (W2*b* in FIG. 3).

The data signal D27 output from the read/write circuit RW7 is input into the input/output circuit IO2 from the node U7 (Ui2 in FIG. 2) via the node W6 (W2*b* in FIG. 3).

The input/output circuit IO1 connects one of the nodes W1 to W4 (W1*b* to W4*b* in FIG. 3) with the data input/output line DQ1 in accordance with the input/output selection signals Y21 to Y24. The input/output circuit IO2 connects one of the nodes W5 to W8 (W1*b* to W4*b* in FIG. 3) with the data input/output line DQ2 in accordance with the input/output selection signals Y21 to Y24. In this case, the data signals D23, D27 received by the nodes W2, W6 are selectively transmitted to the data input/output lines DQ1, DQ2, respectively. This allows the data signals DQ1, DQ2, which are read from the memory blocks M3, M7, to be output.

In the writing operation mode, the read control signal SE is set at a L-level, and the write control signal WE is set at a H-level. Addresses of the memory cells constituting an object of writing are input as the column selection signals Y11 to Y14 and the input/output selection signals Y21 to Y24.

As an example, the input/output selection signals Y21, Y23, Y24 are set at a L-level and Y22 is set at a H-level. It is assumed that the data are to be written into the memory blocks M3, M7.

The input/output selection signals Y21 to Y24 are input into the redundancy selection circuit SC1 via the input/output circuits IO1, IO2. Further, the input/output selection signal Y21 is transmitted from the node W1 to the node U1, and from the node W5 to the node U6. The input/output selection signal Y22 is transmitted from the node W2 to the node U3, and from the node W6 to the node U7. The input/output selection signal Y23 is transmitted from the node W3 to the node U4, and from the node W7 to the node U8. The input/output selection signal Y24 is transmitted from the node W4 to the node U5, and from the node W8 to the node U9.

The input/output circuit IO1 further outputs the data signal DQ1 of the data input/output line DQ1 to one of the four nodes W1 to W4 (W1*b* to W4*b*) in accordance with the input/output selection signals Y21 to Y24. The input/output circuit IO2 further outputs the data signal DQ2 of the data input/output line DQ2 to one of the four nodes W5 to W8 (W1*b* to W4*b*) in accordance with the input/output selection signals Y22 to Y24. The data signals DQ1, DQ2 are transmitted in a direction opposite to the arrows shown in FIG. 5.

The read/write circuits RW1, RW2, RW4 to RW6, RW8, RW9 receive the input/output selection signals (corresponding to SY in FIG. 2) of a L-level. In the read/write circuits RW1, RW2, RW4 to RW6, RW8, RW9, the write driver WD is not operated (non-activated state), since the output of the AND circuit 2 is at a L-level.

On the other hand, the read/write circuits RW3, RW7 receive the input/output selection signal Y22 (corresponding to SY in FIG. 2) of a H-level. In the read/write circuits RW3, RW7, the write driver WD is in an operated state (activated state), since the output of the AND circuit 2 is at a H-level.

By this, the write driver WD of each of the read/write circuits RW3, RW7 is operated to write data into a selected memory cell.

Thus, according to the semiconductor memory device 1000 of the first embodiment, the circuit construction at the boundary of each block is not complicated. Furthermore, if each column group is made of four columns, a redundancy circuit can be constructed by adding a memory cell array of four columns.

Specific comparison will be made. Assuming that each of the memory blocks M1 to M9 is made of 16 columns, the array region including the normal memory cells is made of (16×4)×2 columns, and the total array region is made of 128 columns+16 columns=144 columns. If a semiconductor memory device 9500 is constructed to correspond to the semiconductor memory device 1000, each of the memory blocks XM1 to XM3 is made of 64 columns, and the total sum of the number of columns will be 64 columns×3=192 columns. Therefore, the semiconductor memory device 1000 of the first embodiment has an area reduced by 48 columns.

(Second Embodiment)

Figure 6:
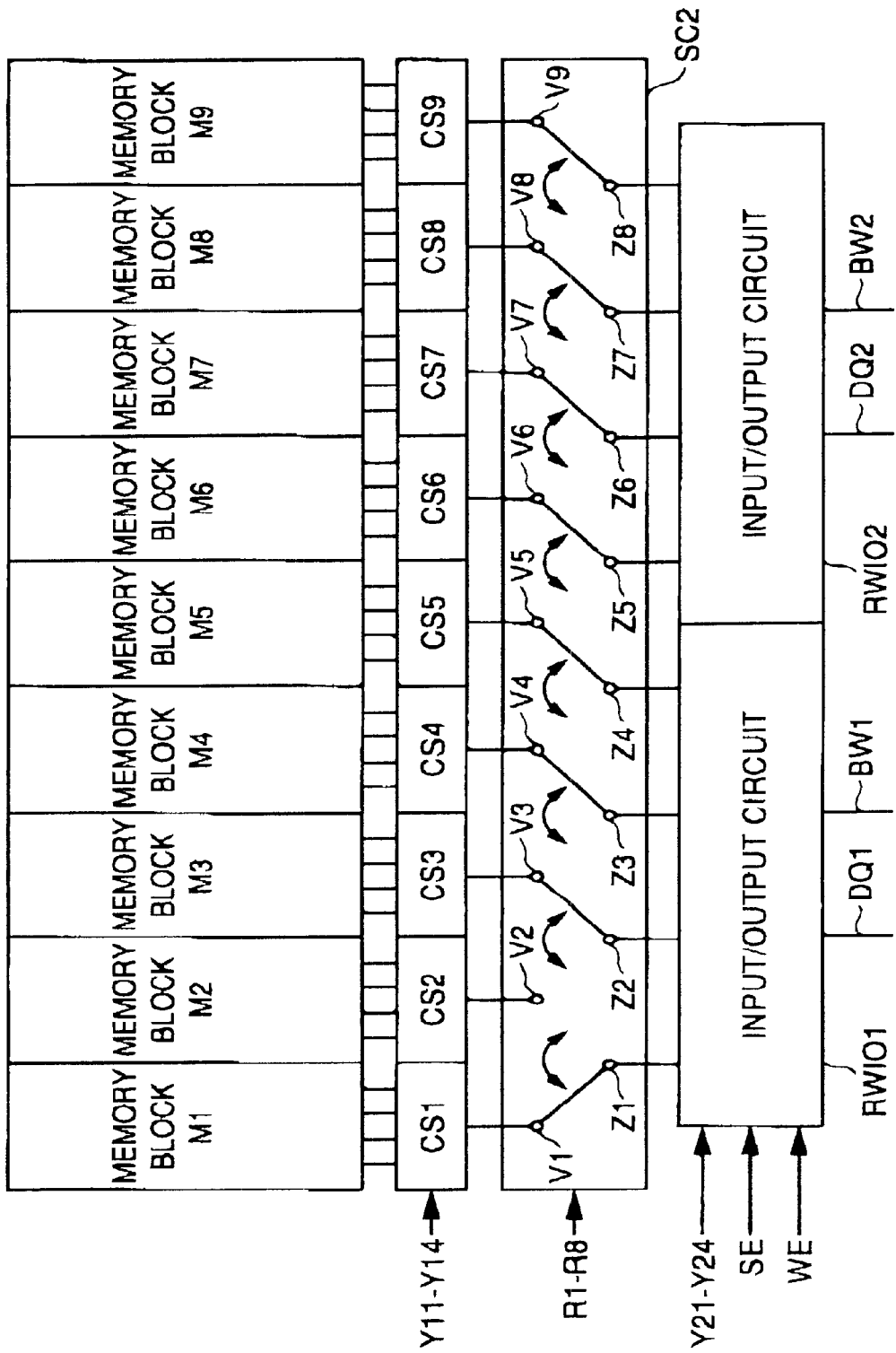
FIG. 6 is a view illustrating a construction of a principal part of a semiconductor memory device 2000 according to a second embodiment.

A semiconductor memory device 2000 according to the second embodiment of the present invention will be described with reference to FIG. 6. Referring to FIG. 6, the semiconductor memory device 2000 includes a plurality of memory blocks M1 to M9, column selection circuits CS1 to CS9 that are disposed respectively in correspondence with the memory blocks, a redundancy selection circuit SC2, and input/output circuits RWIO1, RWIO2.

As described in the first embodiment, each of the column selection circuits CS1 to CS9 selects one of the plurality of column lines included in the corresponding memory block in accordance with the column selection signals Y11 to Y14.

Each of the column selection circuits CS1, CS2, CS3, CS4, CS5, CS6, CS7, CS8, CS9 gives and receives data to and from the input/output circuit via nodes V1, V2, V3, V4, V5, V6, V7, V8, V9.

The redundancy selection circuit SC2 connects either one of the nodes V1, V2 with the node Z1, connects either one of the nodes V2, V3 with the node Z2, connects either one of the nodes V3, V4 with the node Z3, and connects either one of the nodes V4, V5 with the node Z4.

The redundancy selection circuit SC2 further connects either one of the nodes V5, V6 with the node Z5, connects either one of the nodes V6, V7 with the node Z6, connects either one of the nodes V7, V8 with the node Z7, and connects either one of the nodes V8, V9 with the node Z8.

The redundancy selection circuit SC2 shifts connections to exclude one of the nodes V1 to V9 in accordance with redundancy selection signals R1 to R8. Except for one of the nodes Vi (i=1 to 9), the nodes Vj (j≠i) are connected to either one of the nodes Zj and Zj−1. However, the node V1 is either connected to the node Z1 or is in a non-connected state, and the node V9 is either connected to the node V8 or is in a non-connected state.

By shifting the connection relationship, eight signals out of the nine signals output from the column selection circuits CS1 to CS9 are transmitted to the nodes Z1 to Z8, or alternatively the eight signals of the nodes Z1 to Z8 are transmitted to eight circuits out of the column selection circuits CS1 to CS9.

The input/output circuits RWIO1 outputs the data signal DQ1 to the data input/output line DQ1 in accordance with one of the data signals received by the nodes Z1 to Z4, or alternatively outputs the data signal to one of the nodes Z1 to Z4 in accordance with the data signals DQ1 of the data input/output line DQ1.

The input/output circuits RWIO2 outputs the data signal DQ2 to the data input/output line DQ2 in accordance with one of the data signals received by the nodes Z5 to Z8, or alternatively outputs the data signals to one of the nodes Z5 to Z8 in accordance with the data signals DQ2 of the data input/output line DQ2.

The writing operation of the input/output circuit RWIO1 is controlled in accordance with the write control signal WE and the bit write signal BW1, and the reading operation of the input/output circuit RWIO1 is controlled in accordance with the read control signal SE.

The writing operation of the input/output circuit RWIO2 is controlled in accordance with the write control signal WE and the bit write signal BW2, and the reading operation of the input/output circuit RWIO2 is controlled in accordance with the read control signal SE.

Figure 7:
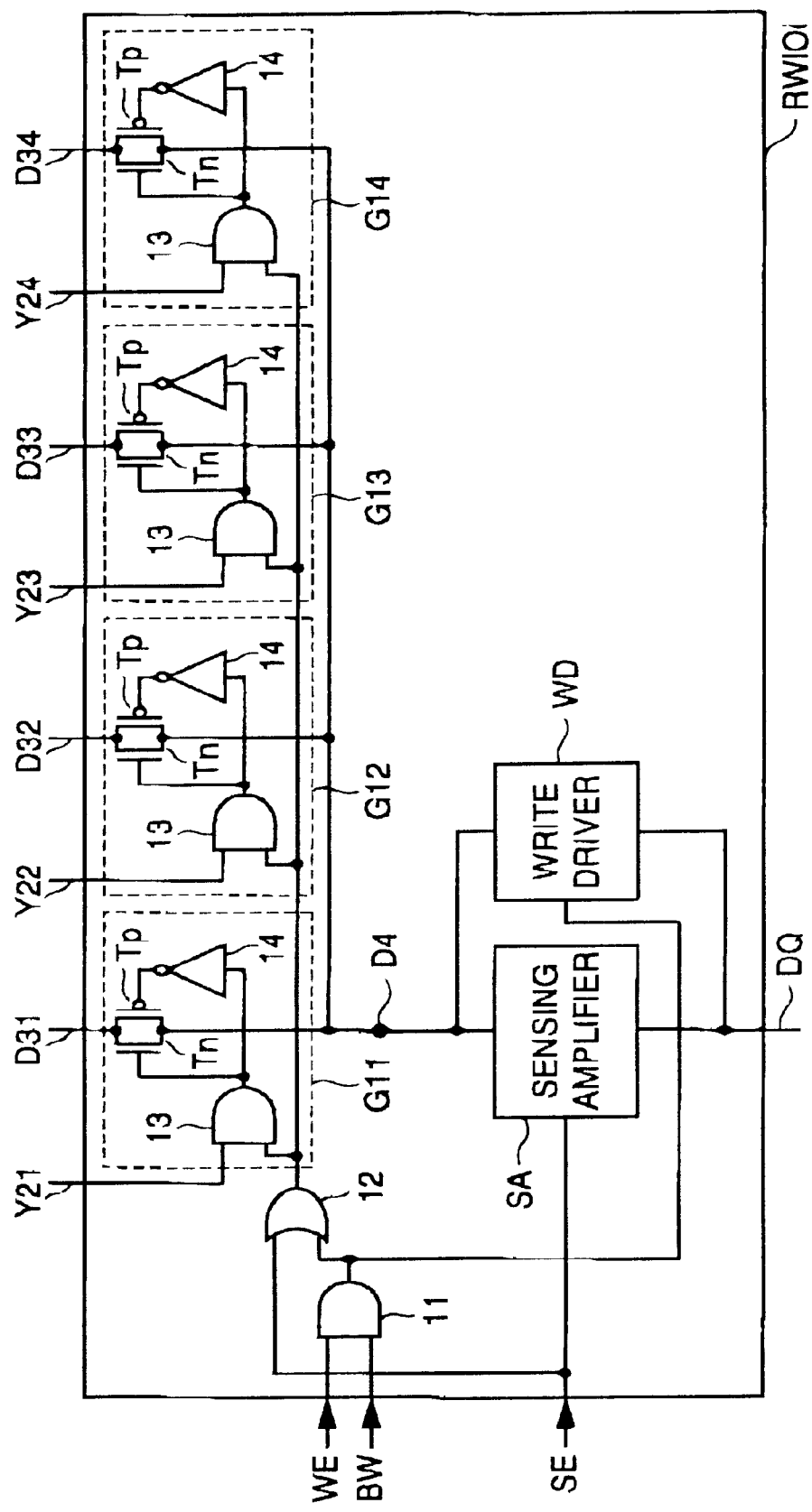
FIG. 7 is a circuit diagram illustrating a construction of an input/output circuit RWIOi according to the second embodiment.

The input/output circuit shown in FIG. 6 will be described in detail with reference to FIG. 7. The input/output circuit RWIOi (i=1, 2) illustrated in FIG. 7 includes an AND circuit 11, an OR circuit 12, a sensing amplifier SA, a write driver WD, and gates G11 to G14.

The symbol BW represents a bit write signal, and signifies BW1 shown in FIG. 6 if it is the input/output circuit RWIO1 and signifies BW2 shown in FIG. 6 if it is the input/output circuit RWIO2. Further, the symbol DQ represents a data signal, and signifies DQ1 shown in FIG. 6 if it is the input/output circuit RWIO1 and signifies DQ2 shown in FIG. 6 if it is the input/output circuit RWIO2. Furthermore, each of the symbols D31 to D34 represents a data signal. The data signals D31 to D34 correspond to the signals of the nodes Z1 to Z4 if it is the input/output circuit RWIO1, and correspond to the signals of the nodes Z5 to Z8 if it is the input/output circuit RWIO2.

The AND circuit 11 receives the write control signal WE and the signal BW as an input. The OR circuit 12 receives the read control signal SE and the output of the AND circuit 11 as an input.

The sensing amplifier SA is activated in accordance with the read control signal SE, and amplifies the data D4 of the node D4 to output the data signal DQ. The sensing amplifier SA outputs the data (read data) of a selected column line to the data input/output line.

The write driver WD is activated in accordance with the output of the AND circuit 11, and outputs the data signal D4 to the node D4 in accordance with the data signal DQ.

Each of the gates G11 to G14 includes an AND circuit 13, an inverter 14 that inverts the output of the AND circuit 13, a transistor Tn that receives the output of the AND circuit 13 at the gate thereof, and a transistor Tp that receives the output of the inverter 14 at the gate thereof. The transistor Tp is a PMOS transistor, and the transistor Tn is an NMOS transistor.

The input/output selection signal Y21 is supplied to the gate G11, the input/output selection signal Y22 is supplied to the gate G12, the input/output selection signal Y23 is supplied to the gate G13, and the input/output selection signal Y24 is supplied to the gate G14.

The AND circuit 13 of the gate G1i (i=1 to 4) receives the output of the OR circuit 12 and the corresponding input/output selection signal. The gate is turned on/off by the output of the AND circuit 13 and the output of the inverter 14 that inverts the output of the AND circuit 13.

When the gate G1i is turned on, the data signal D4 of the node D4 is output as the data signal D3i, or alternatively the data signal D3i is transmitted to the node D4.

Figure 8:
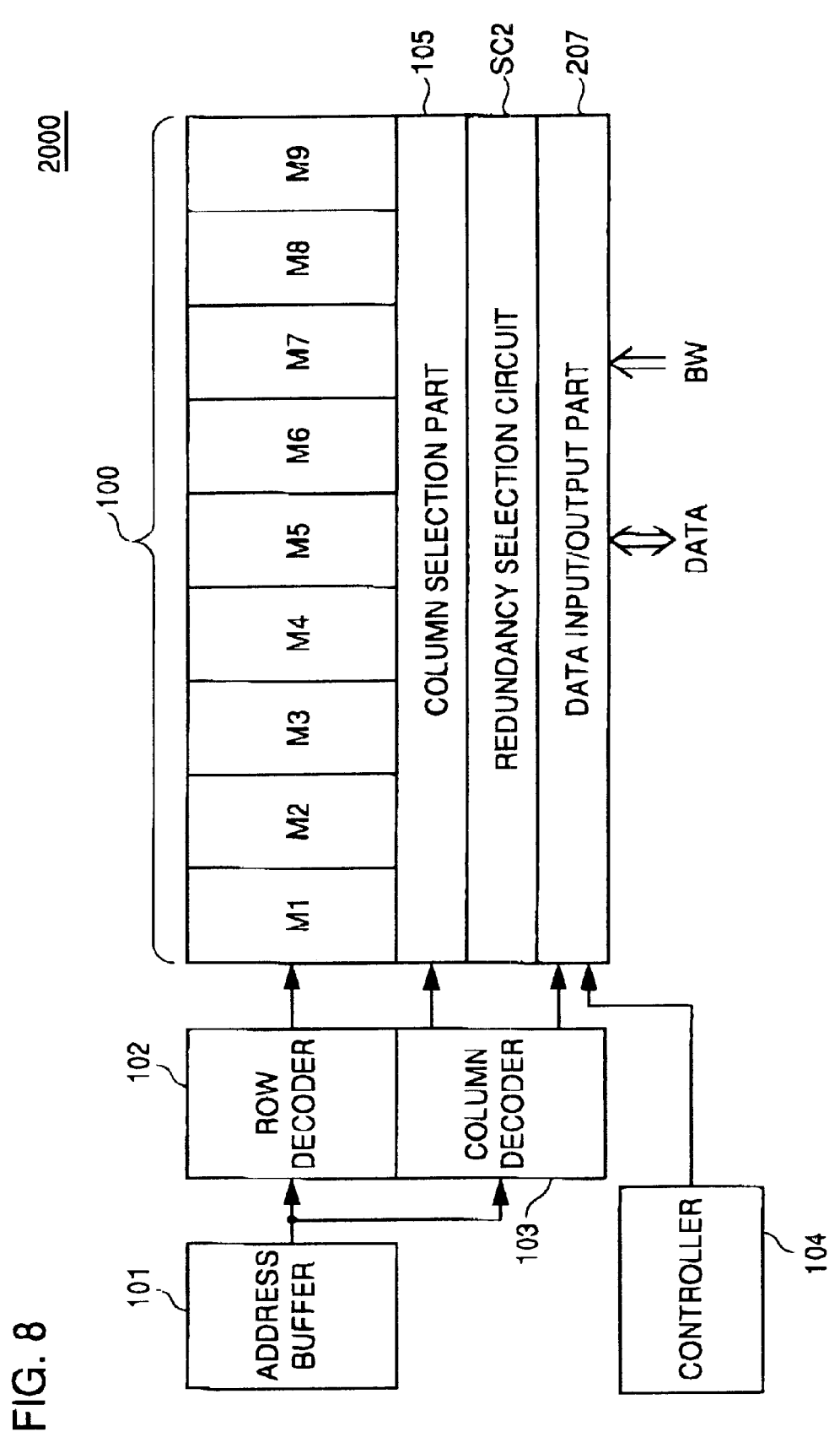
FIG. 8 is a block diagram illustrating a schematic overall construction of the semiconductor memory device 2000 according to the second embodiment.
Figure 9:
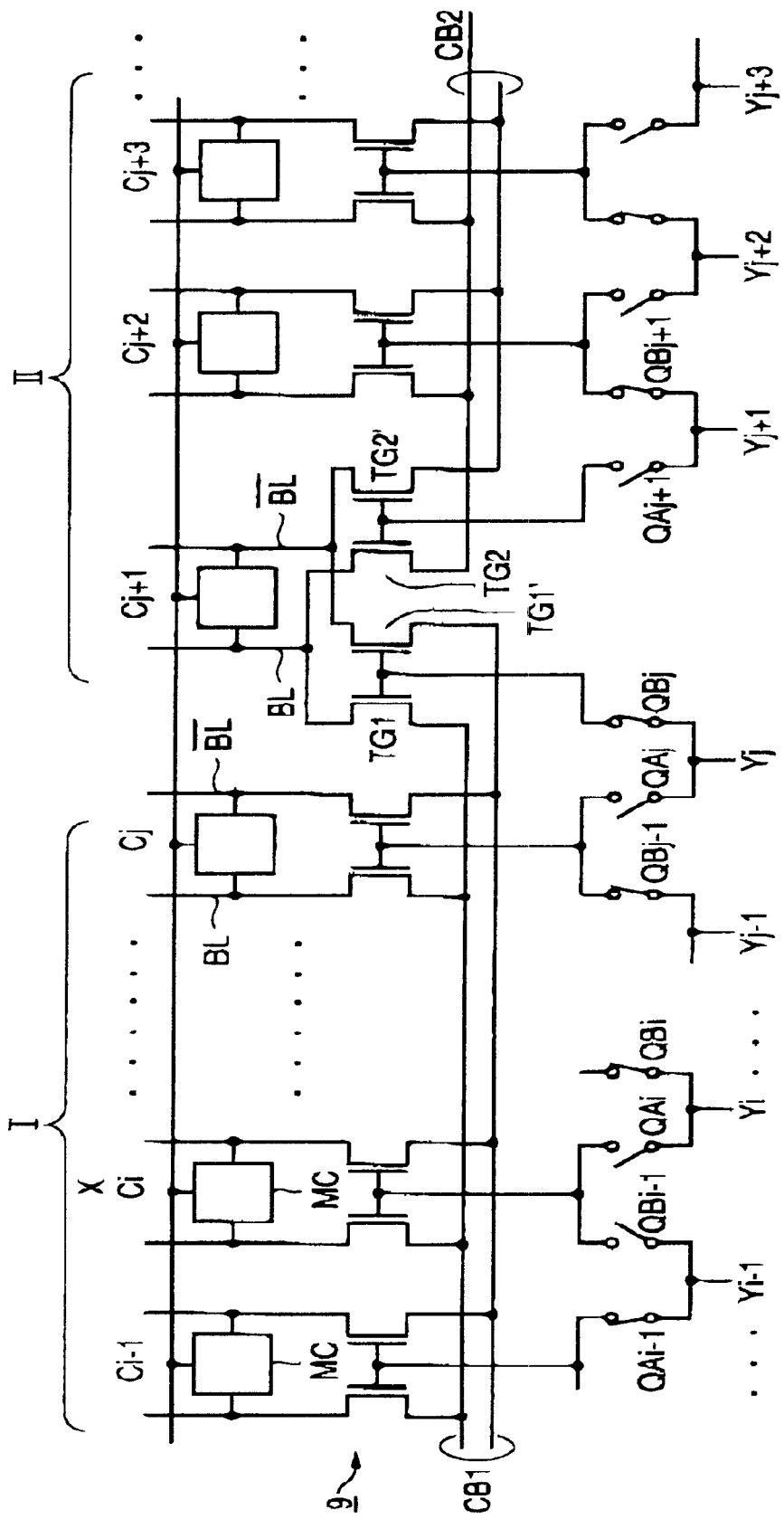
FIG. 9 is a circuit diagram illustrating an example of a conventional redundancy substitution construction.
Figure 10:
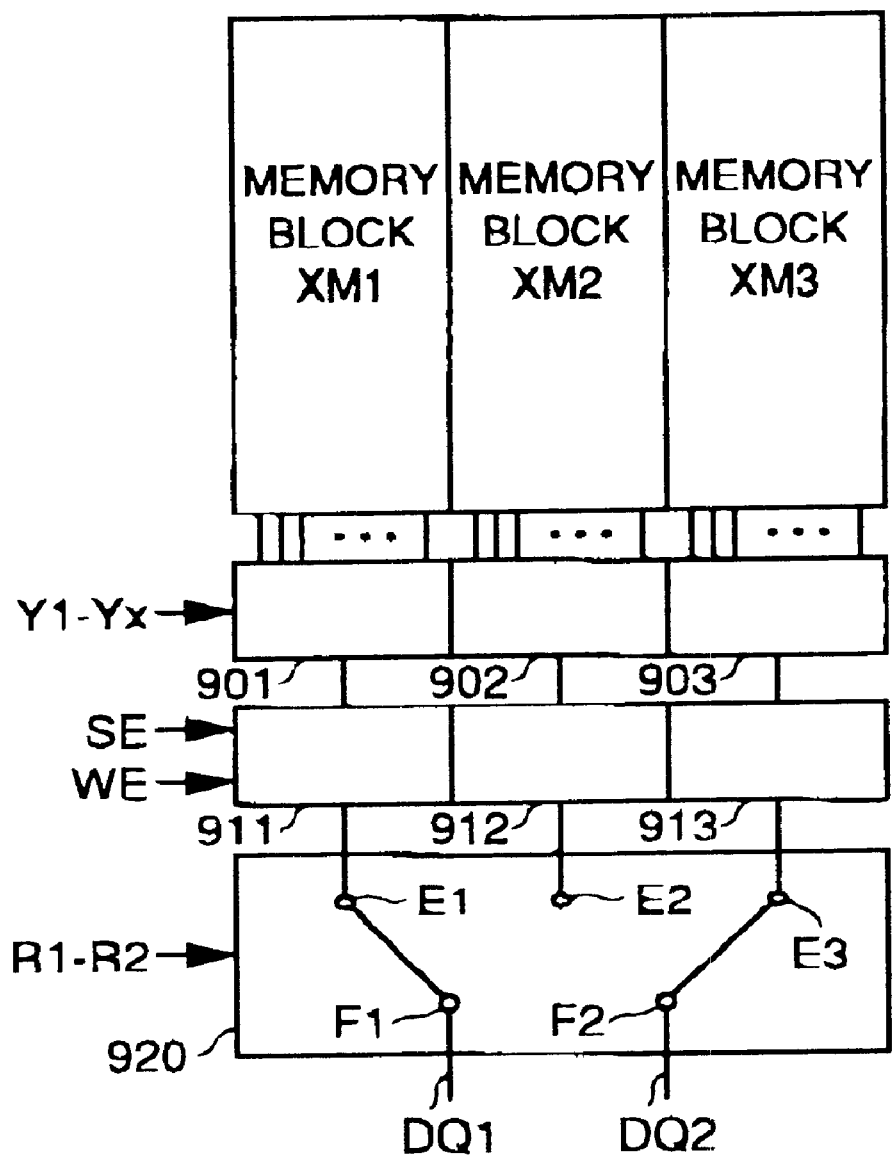
FIG. 10 is a circuit diagram illustrating another example of a conventional redundancy substitution construction.

FIG. 8 illustrates an overall construction of the semiconductor memory device 2000 according to the second embodiment of the present invention. Referring to FIG. 8, the semiconductor memory device 2000 includes a memory cell array 100 including the memory blocks M1 to M9, an address buffer 101 that receives an address, a row decoder 102 that outputs an inner row address by decoding the output of the address buffer 101, a column decoder 103 that outputs the column selection signals Y11 to Y14 and the input/output selection signals Y21 to Y24 by decoding the output of the address buffer 101, and a controller 104 for controlling internal operations.

The semiconductor memory device 2000 further includes a column selection part 105 including the column selection circuits CS1 to CS9, a redundancy selection circuit SC2, and a data input/output part 207 including the input/output circuits RWIO1 and RWIO2.

The column selection part 105 receives the column selection signals Y11 to Y14 from the column decoder 103. The data input/output part 207 receives the input/output selection signals Y21 to Y24 from the column decoder 103 and receives the read control signal SE and the write control signal WE from the controller 104. The data input/output part 207 further receives the bit write signal BW.

Next, the operation of the semiconductor memory device 2000 according to the second embodiment of the present invention will be described with reference to FIGS. 6 to 8. It is assumed that the memory block M2 includes a deficient memory cell.

In the redundancy selection circuit SC2, connection is set in advance as shown in FIG. 6 before the operation of the circuits in accordance with the redundancy selection signals R1 to R8. More specifically, the node Z1 is connected to the node V1, the node Z2 to the node Z3, the node Z3 to the node V4, the node Z4 to the node V5, the node Z5 to the node V6, the node Z6 to the node V7, the node 27 to the node V8, and the node Z8 to the node V9. The node V2 is fixed at a L-level.

In the reading operation mode, the read control signal SE is set at a H-level, and the write signal WE is set at a L-level. Addresses of the memory cells constituting an object of reading are input as the column selection signals Y11 to Y14 and the input/output selection signals Y21 to Y24.

As an example, the input/output selection signals Y21, Y23, Y24 are set at a L-level and Y22 is set at a H-level. It is assumed that the data of the memory blocks M3, M7 are to be read out.

Since the read control signal SE is at a H-level, the output of the OR circuit 12 is at a H-level. The operation of the sensing amplifier SA in the input/output circuits RWIO1, RWIO2 are enabled. The gate is turned on/off in accordance with the input/output selection signals Y21 to Y24. One of the data signals D31 to D34 is transmitted to the node D4.

According to the above-mentioned example, since the input/output selection signal Y22 is at a H-level, the data signal D32 is transmitted to the node D4. The sensing amplifier SA amplifies the data signal D4 of the node D4 to output the data signal DQ.

In the writing operation mode, the read control signal SE is set at a L-level, and the write control signal WE is set at H-level. Addresses of the memory cells constituting an object of writing are input as the column selection signals Y11 to Y14 and the input/output selection signals Y21 to Y24.

As an example, the input/output selection signals Y21, Y23, Y24 are set at a L-level and Y22 is set at a H-level. This allows the memory blocks M3, M7 to be candidates for an object of writing. Further, the bit write signal BW1 is set at a H-level, and the bit write signal BW2 is set at a L-level. This allows the memory block M3 to be an object of writing.

In the input/output circuit RWIO1, the output of the AND circuit 11 is at a H-level, since the write control signal WE and the bit write signal BW1 is at a H-level. Therefore, the write driver WD is in an operated state (activated state). The activated write driver WD outputs the data signal D4 to the node D4 in accordance with the data signal DQ1 of the data input/output line DQ1.

Further, in the input/output circuit RWIO1, the output of the OR circuit 12 is at a H-level. Therefore, one of the gates G11 to G14 is turned on in accordance with the input/output selection signals Y21 to Y24. This allows the data signal D4 to be output as one of the data signals D31 to D34. In the above-mentioned example, since the gate G12 is turned on, the data signal D4 is output as the data signal D32. The data signal D32 is transmitted to the column selection circuit CS3 via the node V3. Therefore, the data is written into the memory cells of the memory block M3.

In the input/output circuit RWIO2, the output of the AND circuit 11 is at a L-level, since the bit write signal BW2 is at a L-level although the write control signal WE is at a H-level. Therefore, the write driver WD is not operated (non-activated state). Therefore, the data signals are not transmitted from the nodes Z5 to Z8 to the nodes V6 to V9, and the data is not written into the memory blocks.

Thus, according to the semiconductor memory device 2000 of the second embodiment, the circuit construction at the boundary of each block is not complicated. Furthermore, if each column group is made of four columns, a redundancy circuit can be constructed by adding a memory cell array of four columns.

Here, the position of the sensing amplifier SA and the write driver WD is not limited to the position shown in the first embodiment or the second embodiment. For example, the sensing amplifier SA may be diagnosed between the redundancy selection circuit and the column selection circuit as depicted in the first embodiment, and the write driver WD may be disposed between the redundancy selection circuit and the data input/output line as depicted in the second embodiment. In any case, the same effects as in the first and second embodiments are produced.

The preferred embodiments herein disclosed are to be construed as being in all aspects illustrative and not restrictive. The scope of the present invention is defined by the appended claims rather than by the deposition preceding them, and all changes that fall within metes and bounds of the claims, or equivalence of such metes and bounds thereof are therefore intended to be embraced by the claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array including m memory blocks (said m is an integer not smaller than 2) each having a plurality of memory cells arranged in a matrix form and n column lines (said n is an integer) connected to the corresponding memory cells;
    m first selection circuits disposed respectively in correspondence with said m memory blocks, each of said m first selection circuits selecting one of said n columns lines included in the corresponding one of said m memory blocks;

m data processing circuits disposed respectively in correspondence with said m first selection circuits, each of said m data processing circuits including one or both of an amplification circuit for amplifying read data from the corresponding first selection circuit and a write circuit for outputting write data to the corresponding first selection circuit;

a redundancy selection circuit that includes m first nodes and (m−1) second nodes for respectively giving and receiving data to and from said m data processing circuits and selectively connects (m−1) first nodes with said (m−1) second nodes by shifting connections to exclude one of said m first nodes; and a second selection circuit that selects one of k second nodes (k≦m−1: said k is an integer) for giving and receiving data.

2. The semiconductor memory device as claimed in claim 1, wherein (m−1)/k amplification circuits are activated among said m amplification circuits at the time of reading data from said memory cell array.

3. The semiconductor memory device as claimed in claim 1, wherein (m−1)/k write circuits are activated among said m write circuits at the time of writing data to said memory cell array.

4. The semiconductor memory device as claimed in claim 2, wherein said amplification circuit is activated at the time of reading data from the corresponding memory block.

5. The semiconductor memory device as claimed in claim 3, wherein said write circuit is activated at the time of writing data to the corresponding memory block.

6. A semiconductor memory device comprising:

a memory cell array including m memory blocks (said m is an integer not smaller than 2) each having a plurality of memory cells arranged in a matrix from and n column lines (said n is an integer) connected to the corresponding memory cells;

m first selection circuits disposed respectively in correspondence with said m memory blocks, each of said m first selection circuits selecting one of said n column lines included in the corresponding one of said m memory blocks;

a redundancy selection circuit that includes m first nodes and (m−1) second nodes for respectively giving and receiving data to and from said m first selection circuits and selectively connects (m−1) first nodes with said (m−1) second nodes by shifting connection to exclude one of said m first nodes;

a second selection circuit that selects one of k second nodes (k≦m−1: said k is an integer) for giving and receiving data; and one or both of an amplification circuit for applying data output from said second selection circuit and a write circuit for outputting data to said second selection circuit.

7. The semiconductor memory device as claimed in claim 6, wherein said second selection circuit includes a plurality of gates that are disposed respectively in correspondence with said k second nodes and are connected to said amplification circuit and said write circuit.

8. The semiconductor memory device as claimed in claim 7, wherein said second selection circuit, said write circuit, and said amplification circuit are disposed in a plural number, and wherein only write circuit for writing data to memory block that constitutes an object of writing data is operated among said write circuits disposed in the plural number.

* * * * *